(12) United States Patent
Yang et al.

(10) Patent No.: US 10,153,741 B2
(45) Date of Patent: Dec. 11, 2018

(54) AVERAGE POWER TRACKING MODE POWER AMPLIFIER USING DUAL BIAS VOLTAGE LEVELS

(71) Applicant: RESEARCH & BUSINESS FOUNDATION SUNGKYUNKWAN UNIVERSITY, Suwon-si (KR)

(72) Inventors: Youngoo Yang, Hwaseong-si (KR); Won Seob Lim, Ansan-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 3 days.

(21) Appl. No.: 15/175,205

(22) Filed: Jun. 7, 2016

(65) Prior Publication Data

US 2017/0005629 A1 Jan. 5, 2017

(30) Foreign Application Priority Data

Jun. 30, 2015 (KR) .......................... 10-2015-0093600

(51) Int. Cl.
| | | |
|---|---|---|
| *H03F 3/04* | (2006.01) | |
| *H03F 3/24* | (2006.01) | |
| *H03F 3/19* | (2006.01) | |
| *H03F 1/02* | (2006.01) | |

(52) U.S. Cl.
CPC ........... *H03F 3/245* (2013.01); *H03F 1/0238* (2013.01); *H03F 3/19* (2013.01); *H03F 2200/105* (2013.01); *H03F 2200/324* (2013.01); *H03F 2200/411* (2013.01); *H03F 2200/451* (2013.01); *H03F 2200/516* (2013.01)

(58) Field of Classification Search
CPC ........... H03F 3/245; H03F 1/0238; H03F 3/19
USPC ................................. 330/296, 297, 136, 127
See application file for complete search history.

(56) References Cited

U.S. PATENT DOCUMENTS

| | | | | |
|---|---|---|---|---|
| 6,639,471 | B2 * | 10/2003 | Matsuura ............... | H03F 1/0227 330/285 |
| 7,038,536 | B2 * | 5/2006 | Cioffi .................... | H03F 1/0205 330/10 |
| 2012/0034956 | A1 * | 2/2012 | Green ................... | H03F 1/0261 455/571 |

* cited by examiner

*Primary Examiner* — Khanh V Nguyen
*Assistant Examiner* — Khiem Nguyen
(74) *Attorney, Agent, or Firm* — NSIP Law

(57) ABSTRACT

An average power tracking mode power amplifier is disclosed herein. The average power tracking mode power amplifier includes a Power Amplifier (PA), a first Direct Current (DC)-DC voltage converter, and a second DC-DC voltage converter. The PA includes a driver stage configured to be driven by first drive voltage and a main amplification stage configured to be driven by second drive voltage. The first DC-DC voltage converter generates the first drive voltage from power voltage so that the first drive voltage is equal to or higher than the power voltage, and applies the generated first drive voltage to the driver stage. The second DC-DC voltage converter generates the second drive voltage from the power voltage so that the second drive voltage is higher than the first drive voltage, and applies the generated second drive voltage to the main amplification stage.

18 Claims, 3 Drawing Sheets

AVERAGE POWER TRACKING MODE POWER AMPLIFIER USING DUAL BIAS VOLTAGE LEVELS

CROSS-REFERENCE TO RELATED APPLICATION

This application claims the benefit under 35 USC 119(a) of Korean Patent Application No. 10-2015-0093600, filed on Jun. 30, 2015 in the Korean Intellectual Property Office, the disclosure of which is incorporated herein in its entirety by reference.

BACKGROUND

1. Field

The following description relates generally to an average power tracking mode amplifier.

2. Description of the Related Art

Recent wireless communication systems use a modulation method having high Peak to Average Power Ratio (PAPR), such as Orthogonal Frequency Division Multiplexing (OFDM), so that the wireless communication systems can not only efficiently use limited frequency resources but can also process a large amount of data.

In a modulation method having high PAPR, a Power Amplifier (PA) may be implemented as a highly efficient PA, such as a Class C, D, E or F amplifier, in order to maximize efficiency. Although such Power Amplifiers (PAs) can operate at high efficiency in a compression region, for example, in a saturation region, these PAs require an additional linearization technique due to the nonlinearity of the compression region. Thus efficiency is not considerably improved in terms of an overall system.

Furthermore, although such PAs operate at high efficiency, the efficiency of the PAs is poor in a region lower than a maximum power point, such as a back-off region. Since wireless communication systems operate in a back-off region lower than the PAPR during most of the operating period, efficiency becomes poor at average power as a result.

In order to overcome these problems, there have been proposed an Envelope Tracking (ET) power amplification method of applying a bias, whose voltage level is modulated according to the envelope of a Radio Frequency (RF) input signal, and an RF input signal to a linear mode PA, rather than applying a bias to a PA in a fixed manner; and an Envelope Elimination and Restoration (EER) power amplification method of applying an input signal, whose envelope has been eliminated using a bias, modulated according to an envelope, and a limiter, and in which only a phase component remains, to a switching mode PA.

Of these methods, the ET power amplification method has somewhat lower efficiency than the EER power amplification method, but has advantages in that a reduction in linearity is lower in spite of unavoidable temporal mismatch between an RF input signal path for a PA and a modulated bias path and in that the structure of a bias modulator is simpler.

Furthermore, there has emerged a hybrid envelope tracking power amplification method that combines the EER method and the ET method and that applies a bias, whose voltage level is modulated according to an envelope, and an RF an input signal to a switching mode PA.

In this hybrid envelope tracking power amplification method, a bias modulator may be implemented as a linear amplifier configured to provide wide bandwidth and a switching amplifier configured to have high efficiency in order to generate a bias voltage modulated based on a detected envelope, thereby achieving both fast operation and high efficiency.

Generally, the efficiency of a bias modulator increases or decreases in proportion to output power, and thus overall efficiency is determined based on a bias voltage, output to a PA, and load resistance. In other words, when an output bias voltage modulated by the bias modulator is low because the size of an envelope is small, the power efficiency of the bias modulator is decreased.

In order to overcome this problem, a Direct Current to Direct Current (DC-DC) converter is added into a bias modulator, and an operating voltage for a linear amplifier is lowered using the DC-DC converter when an output bias voltage is low, thereby improving the efficiency of the bias modulator. However, this scheme requires that the linear amplifier be designed to operate desirably at different operating voltages, and causes a new problem in which a circuit and power consumption are increased by the added DC-DC converter.

Meanwhile, since the swing of an RF input signal, which can be considered to be the maximum size of an envelope, cannot exceed circuit drive voltage, for example, battery voltage, the bias voltage modulated according to the envelope in order to drive a PA in envelope tracking mode is generated as a voltage having a level that is the same as or lower than that of the battery voltage. Accordingly, the PA also operates in a voltage range equal to or lower than battery voltage, and the current driving capability of the PA needs to be high in order to obtain high output power using such a low voltage. A circuit whose current is relatively high and whose voltage is relatively low must have relatively low input/output impedance.

The input impedance of the PA must match the output impedance of a modulation circuit adapted to provide an RF input signal at the front end of the PA, and also the output impedance of the PA must match the 50Ω impedance of an antenna adapted to radiate an RF output signal at the back end of the PA. If the PA is composed of multistage amplification circuits, impedance matching circuits may be required among these multistage amplification circuits. These impedance matching circuits cause the problem of increasing manufacturing costs because they occupy a corresponding substrate or chip area, and the problem of reducing efficiency because they generate considerable loss.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to an aspect of the following description, there is provided an average power tracking mode power amplifier that includes a Power Amplifier (PA) comprising a driver stage configured to be driven by first drive voltage and a main amplification stage configured to be driven by second drive voltage, a first Direct Current (DC)-DC voltage converter configured to generate the first drive voltage from power voltage so that the first drive voltage is equal to or higher than the power voltage, and to apply the generated first drive voltage to the driver stage, and a second DC-DC voltage converter configured to generate the second drive voltage from the power voltage so that the second drive voltage is higher than the first drive voltage, and to apply the generated second drive voltage to the main amplification stage.

The second DC-DC voltage converter may be operative to generate the second drive voltage by boosting the power voltage based on a load line condition, which enables output impedance of the main amplification stage to match nominal impedance of an antenna, and average output power.

The main amplification stage and the antenna may be coupled to a DC blocking capacitor.

The first DC-DC voltage converter may be operative to generate the first drive voltage by stepping down the power voltage based on a load line condition, which enables output impedance of the driver stage to match input impedance of the main amplification stage, and the average output power.

The driver stage and the main amplification stage may be coupled to a DC blocking capacitor.

The second DC-DC voltage converter may be operated using a buck-boost method of generating the second drive voltage from the power voltage so that the second drive voltage is lower than the power voltage and higher than the first drive voltage when the first drive voltage is lower than the power voltage.

The average power tracking mode power amplifier may further include an average output power measurement unit configured to measure average output power of a radio frequency (RF) output signal output from the main amplification stage.

The average power tracking mode power amplifier may further include a modulation unit, and an antenna.

The average power tracking mode power amplifier may apply about 20 V to the main amplification stage when the power voltage is 5 V.

According to another aspect of the following description, there is provided an average power tracking mode power amplifier that includes a PA comprising a driver stage configured to be driven by power voltage and a main amplification stage configured to be driven by drive voltage, a DC-DC voltage converter configured to generate the drive voltage from the power voltage so that the drive voltage is higher than the power voltage, and to apply the generated drive voltage to the main amplification stage.

The DC-DC voltage converter may be operative to generate the drive voltage by boosting the power voltage based on a load line condition, which enables output impedance of the main amplification stage to match nominal impedance of an antenna, and average output power.

The main amplification stage and the antenna may be coupled to a DC blocking capacitor.

The average power tracking mode power amplifier may apply 20 V when the power voltage is 5 V to the main amplification stage.

According to another aspect of the following description, there is provided an average power tracking mode power method that includes generating a first drive voltage from power voltage, via a first DC-DC voltage converter, so that the first drive voltage is equal to or higher than the power voltage, applying the generated first drive voltage to a driver stage, driving the driver stage by the first drive voltage, generating the second drive voltage from the power voltage, via a second DC-DC voltage converter, so that the second drive voltage is higher than the first drive voltage, applying the generated second drive voltage to a main amplification stage; and driving the main amplification stage by the second drive voltage.

The second DC-DC voltage converter may be operative to generate the second drive voltage by boosting the power voltage based on a load line condition, which enables output impedance of the main amplification stage to match nominal impedance of an antenna, and average output power.

The first DC-DC voltage converter may be operative to generate the first drive voltage by stepping down the power voltage based on a load line condition, which enables output impedance of the driver stage to match input impedance of the main amplification stage, and the average output power.

The second DC-DC voltage converter may be operated using a buck-boost method of generating the second drive voltage from the power voltage so that the second drive voltage is lower than the power voltage and higher than the first drive voltage when the first drive voltage is lower than the power voltage.

The main amplification stage and the antenna may be coupled to a DC blocking capacitor.

The average power tracking mode power amplifier may apply 20 V to the main amplification stage when the power voltage is 5 V.

Other features and aspects will be apparent from the following detailed description, the drawings, and the claims.

BRIEF DESCRIPTION OF THE DRAWINGS

The above and other objects, features and advantages of the following description will be more clearly understood from the detailed description taken in conjunction with the accompanying drawings, in which.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
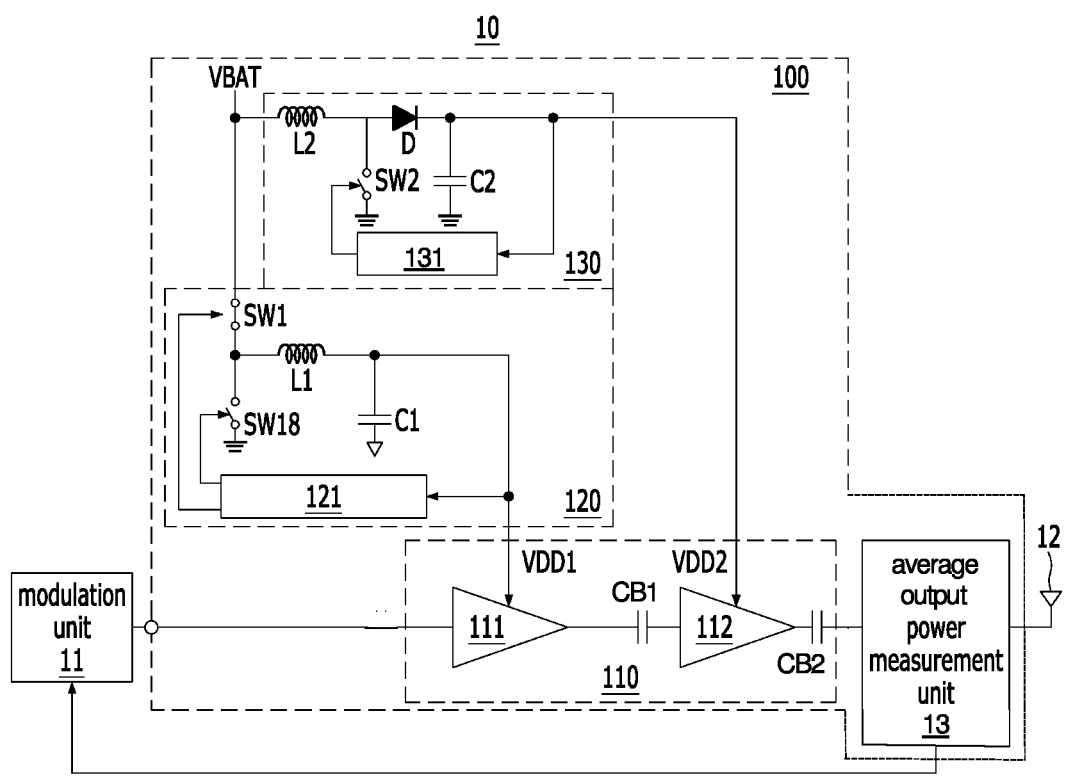
FIG. 1 is a circuit diagram illustrating an average power tracking mode power amplifier using dual bias voltage levels and a wireless transmission apparatus including the same according to an example embodiment.

FIG. 1 is a circuit diagram illustrating a wireless transmission apparatus 10 and an average power tracking mode power amplifier 100 using dual bias voltage levels according to an example embodiment.

Referring to FIG. 1, the wireless transmission apparatus 10 according to the example embodiment may include a modulation unit 11, an average power tracking mode power amplifier 100, and an antenna 12.

The modulation unit 11 is configured to generate a modulated input signal RF_IN according to a predetermined modulation algorithm.

The average power tracking mode power amplifier 100 using dual bias voltage levels may include a PA 110, a first DC-DC voltage converter 120, and a second DC-DC voltage converter 130, and may further include an average output power measurement unit 13.

The PA 110 may include a driver stage 111 configured to be driven by first drive voltage VDD1 and a main amplification stage 112 configured to be driven by second drive voltage VDD2. The impedance of the PA 110 needs to match both the output impedance of the modulation unit 11 and the nominal impedance of the antenna 12. Normally, it is difficult for an amplifier using a single active element to satisfy these impedance matching relationships and to obtain desired gain, a multistage amplifier, such as the PA 110, may be constructed.

A conventional PA drives a driver stage using a common battery power voltage, and drives a main amplification stage using a drive voltage voltage-dropped from the battery power voltage in order to improve power efficiency when output power is low. Accordingly, impedance matching circuits need to be added between the main amplification stage and the antenna and between the driver stage and the main amplification stage in order to eliminate occurring impedance mismatching.

The average power tracking mode power amplifier 100 using dual bias voltage levels according to the example embodiment applies the second drive voltage VDD2 of the main amplification stage 112 higher than the first drive voltage VDD1 of the driver stage 111, preferably higher than the power voltage VBAT. For example, the average power tracking mode power amplifier 100 applies about 20 V to the main amplification stage 112 when the power voltage is 5 V. This eliminates a need for an impedance matching circuit between the main amplification stage and the antenna. This also replaces a low-loss passive element, such as a DC blocking capacitor, with the impedance matching circuit.

Furthermore, the average power tracking mode power amplifier 100 using dual bias voltage levels according to the example embodiment applies a voltage lower than the power voltage VBAT to the driver stage 111 in response to a change when the first drive voltage VDD1 of the driver stage 111 becomes the same as the power voltage VBAT or when the output power is decreased. This eliminates a need for an impedance matching circuit between the main amplification stage and the antenna. This also enables a passive element having low loss, such as a DC blocking capacitor, to replace an impedance matching circuit.

For this purpose, the first DC-DC voltage converter 120 may generate the first drive voltage VDD1 from the power voltage VBAT so that the first drive voltage VDD1 is the same as or lower than the power voltage VBAT. The first DC-DC voltage converter 120 may also apply the generated first drive voltage VDD1 to the driver stage 111.

Specifically, the first DC-DC voltage converter 120 connects one of the power voltage VBAT and the ground voltage GND to an inductor L1 and a capacitor C1, which are connected in series, using switches SW1 and SW1B. It should be noted that switches SW1 and SW1B are complementarily switched at a predetermined duty ratio by the first control unit 121. This enables the first drive voltage VDD1 equal to or lower than the power voltage VBAT to appear in the capacitor C1 according to the duty ratio of the switches SW1 and SW1B.

Furthermore, the second DC-DC voltage converter 130 may generate the second drive voltage VDD2 higher than the first drive voltage VDD1 from the power voltage VBAT, and may apply the second drive voltage VDD2 to the main amplification stage 112.

Specifically, the second DC-DC voltage converter 130 connects one end of an inductor L2, whose other end is connected to the power voltage VBAT, to one of a diode D and a capacitor C2 or ground voltage GND, which are connected in series, using the second switch SW2 that is switched at a predetermined duty ratio by the second control unit 131. This enables the second drive voltage VDD2 equal to or higher than the power voltage VBAT to appear in the capacitor C2 according to the duty ratio of the second switch SW2.

The duty ratio that is controlled by the first control unit 121 or second control unit 131 is determined based on a load line condition and the magnitude of average output power, which will be described later. The magnitude of the average output power changes much less gradually than an envelope, and thus the first control unit 121 or second control unit 131 may be implemented in a simpler form than that of an envelope tracking method.

One of the criteria based on which the second DC-DC voltage converter 130 determines the magnitude of the second drive voltage VDD2 is a load line condition that enables the output impedance of the main amplification stage to match the nominal impedance of the antenna.

Figure 2:
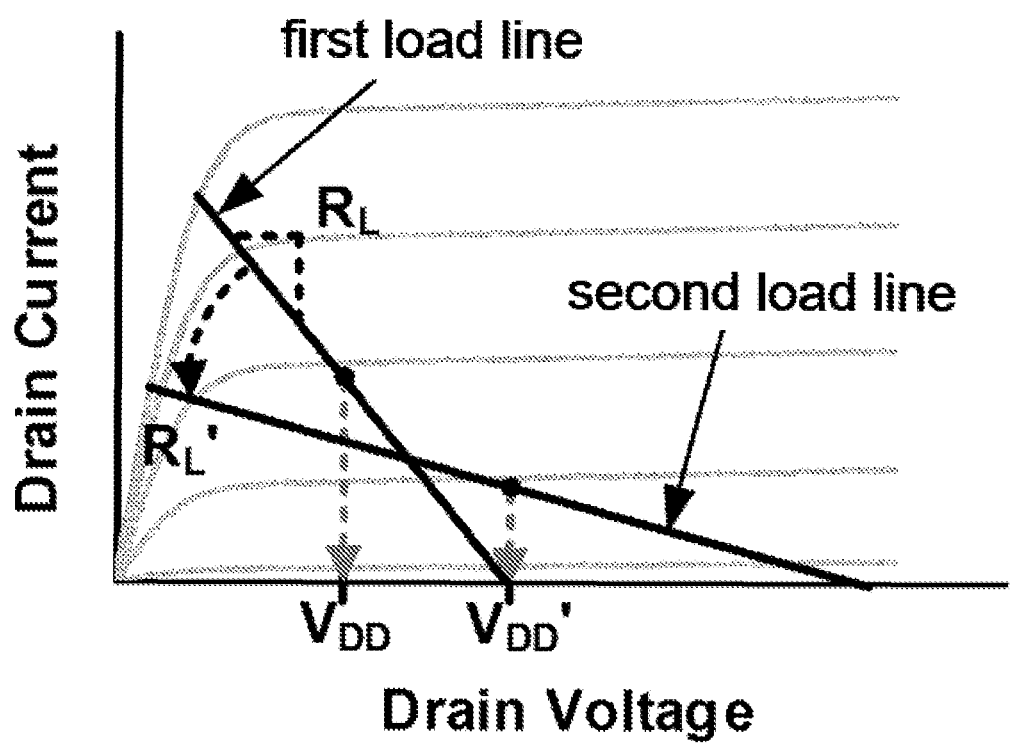
FIG. 2 is a graph illustrating a load line in an average power tracking mode power amplifier using dual bias voltage levels according to an example embodiment.

In a description of a load line, FIG. 2 is a graph illustrating a load line in an average power tracking mode power amplifier using dual bias voltage levels according to an example embodiment.

FIG. 2 illustrates a main amplification stage that is a class A output stage implemented using, for example, a Metal Oxide Semiconductor Feld Effect Transistor (MOSFET) element. Additionally, the relationship between drain voltage and drain current is shown in a graph of FIG. 2.

When the main amplification stage generates an RF output signal having the same output power, the main amplification stage needs to drive a larger amount of current in order to generate an RF output signal having high output power using a low operating voltage V, and thus operates along a steep first load line. In contrast, when the main amplification stage operates using a high operating voltage V, the main amplification stage drives a smaller amount of current, and thus may operate along a gradual second load line.

Since the reciprocal of the slope of a load line is output impedance, the output impedance of the main amplification stage is low in the case of a low operating voltage V and is high in the case of a high operating voltage V. In the case of the first load line that generates an operating voltage $V_{DD}$ equal to or lower than a battery voltage, the main amplification stage comes to have an output impedance considerably lower than the nominal impedance of the antenna, and thus an impedance matching circuit is essential between the antenna and the main amplification stage.

In contrast, in the case of the second load line that generates a high operating voltage V boosted from a power voltage supplied by the battery, the main amplification stage comes to have output impedance similar to the nominal impedance of the antenna, and thus an impedance matching circuit is not required between the antenna and the main amplification stage and it is sufficient if DC blocking is provided.

According to these results of the observation, as long as the main amplification stage operates along the second load line that enables the output impedance of the main amplification stage to match the nominal impedance of the antenna even when the output power is variable, an advantage in which an impedance matching circuit is not required between the antenna and the main amplification stage is maintained. Accordingly, for the main amplification stage to operate at one of various operating points along the second load line, the magnitude of the second drive voltage VDD2 may be determined based on an operating point on the second load line and the magnitude of required output power.

In the same manner, the magnitude of the first drive voltage VDD1 may be determined based on an operating point on a load line. This enables the impedance of the driver stage to which the first drive voltage VDD1 is applied to match that of the main amplification stage, and the magnitude of required output power.

Accordingly, returning to FIG. 1, the second DC-DC voltage converter 130 may generate the second drive voltage VDD2 from the power voltage VBAT, for example, by boosting the power voltage VBAT in an example embodiment, based on a load line condition. This enables the output impedance of the main amplification stage 112 to match the nominal impedance of the antenna 12, and average output power.

When the magnitude of the average output power is considerably decreased in a situation, an operating point on the load line condition may become lower than the power voltage VBAT. For this purpose, the second DC-DC voltage converter 130 needs to generate the second drive voltage VDD2 so that it is higher than the power voltage VBAT in most cases or is higher than the first drive voltage VDD1 and lower than the power voltage VBAT in a situation. This may be implemented as a buck-boost type DC-DC voltage converter.

Furthermore, since an impedance matching circuit has become unnecessary between the main amplification stage 112 and the antenna 12, the main amplification stage 112 and the antenna 12 may be coupled to only a DC blocking capacitor CB2.

Meanwhile, the first DC-DC voltage converter 120 may generate the first drive voltage VDD1 from the power voltage VBAT, for example, by stepping down power voltage VBAT in an example embodiment, based on a load line condition that enables the output impedance of the driver stage 111 to match the input impedance of the main amplification stage 112 and average output power.

The driver stage 111 and the main amplification stage 112 may be coupled to only the DC blocking capacitor CB1.

The average output power measurement unit 13 may measure the average output power of an RF output signal output from the main amplification stage 112, and may provide information about the measured average output power to each of the first and second control units 121 and 131.

Figure 3:
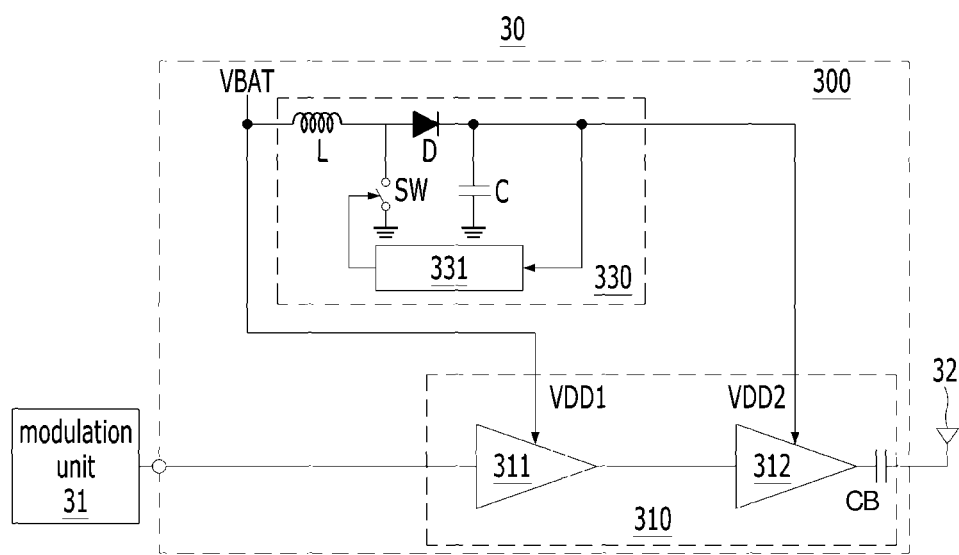
FIG. 3 is a circuit diagram illustrating an average power tracking mode power amplifier using dual bias voltage levels and a wireless transmission apparatus including the same according to another example embodiment.

FIG. 3 is a circuit diagram illustrating a wireless transmission apparatus 30 and an average power tracking mode power amplifier 300 using dual bias voltage levels according to another example embodiment.

Referring to FIG. 3, the modulation unit 31 and antenna 32 of the wireless transmission apparatus 30 of FIG. 3 are substantially the same as the modulation unit 11 and antenna 12 of the wireless transmission apparatus 10 of FIG. 1, and thus descriptions thereof are omitted.

The average power tracking mode power amplifier 300 of the wireless transmission apparatus 30 may include a PA 310, and a DC-DC voltage converter 330, and may further include an average output power measurement unit in an example embodiment.

The PA 310 may include a driver stage 311 configured to be driven by a first drive voltage VDD1, and a main amplification stage 312 configured to be driven by a second drive voltage VDD2.

The average power tracking mode power amplifier 300 using dual bias voltage levels may apply the second drive voltage VDD2 higher than the first drive voltage VDD1 of the driver stage 311 of the main amplification stage 312, preferably higher than the power voltage VBAT., For example average power tracking mode power amplifier 300 applies about 20 V when the power voltage is 5 V to the main amplification stage 112. This eliminates a need for an impedance matching circuit between the main amplification stage and the antenna or replacing a low-loss passive element, such as a DC blocking capacitor, with the impedance matching circuit.

In this case, the first drive voltage VDD1 may be substantially the same as the battery voltage, or may be substantially the same as the power voltage VBAT that is supplied to other circuits including the modulation unit 31 in the same manner.

Accordingly, the DC-DC voltage converter 330 may generate the second drive voltage VDD2 higher than the first drive voltage VDD1 from the power voltage VBAT, and may apply the generated second drive voltage VDD2 to the main amplification stage 312.

Specifically, the DC-DC voltage converter 330 connects one end of an inductor L, whose other end is connected to the power voltage VBAT, to one of a diode D and a capacitor C or ground voltage GND, which is connected in series, using a switch SW that is switched at a predetermined duty ratio by the second control unit 331. This enables the second drive voltage VDD2 equal to or higher than the power voltage VBAT to appear in the capacitor C according to the duty ratio of the second switch SW.

The duty ratio that is controlled by the first control unit 331 is determined based on a load line condition and the magnitude of average output power. The magnitude of the average output power changes much less gradually than an envelope, and thus the control unit 331 may be implemented in a simpler form than that of an envelope tracking method.

One of the criteria based on which the DC-DC voltage converter 330 determines the magnitude of the second drive voltage VDD2 is a load line condition that enables the output impedance of the main amplification stage to match the nominal impedance of the antenna.

Accordingly, the DC-DC voltage converter 330 may generate the second drive voltage VDD2 from the power voltage VBAT, for example, by boosting the power voltage VBAT in an example embodiment, based on a load line condition. This enables the output impedance of the main amplification stage 312 to match the nominal impedance of the antenna 32, and an average output power.

Furthermore, since an impedance matching circuit has become unnecessary between the main amplification stage 312 and the antenna 32, the main amplification stage 312 and the antenna 32 may be coupled to only a DC blocking capacitor CB.

However, unlike in FIG. 1, the driver stage 311 and the main amplification stage 312 may be coupled to a predetermined impedance matching circuit 313.

The average output power measurement unit may measure the average output power of an RF output signal output from the main amplification stage 312, and may provide information about the measured average output power to the control unit 321.

An average power tracking mode power amplifier using dual bias voltage levels according to at least one example embodiment can reduce or substantially eliminate the burden of impedance matching.

An average power tracking mode power amplifier using dual bias voltage levels according to at least one example embodiment can increase bandwidth and mitigate a substrate area problem or a power problem.

The above example embodiments and the accompanying drawings are intended merely to clearly illustrate part of the technical spirit of the inventive concept, and it will be apparent to those skilled in the art that modifications and specific embodiments that those skilled in the art can easily derive from the present specification and the accompanying drawings are all included.

The apparatuses, units, modules, devices, and other components illustrated in FIGS. 1-3, for example, that may perform operations described herein with respect to FIGS. 1-3, for example, are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processing devices, or processors, or computers. A processing device, processor, or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processing device, processor, or computer includes, or is connected to, one or more memories storing instructions or software that are executed by the processing device, processor, or computer and that may control the processing device, processor, or computer to implement one or more methods described herein. Hardware components implemented by a processing device, processor, or computer execute instructions or software, such as an operating system (OS) and one or more software applications that run on the OS, to perform the operations described herein with respect to FIGS. 1-3, for example. The hardware components also access, manipulate, process, create, and store data in response to execution of the instructions or software. For simplicity, the singular term "processing device", "processor", or "computer" may be used in the description of the examples described herein, but in other examples multiple processing devices, processors, or computers are used, or a processing device, processor, or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, remote processing environments, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-5 that perform the operations described herein may be performed by a processing device, processor, or a computer as described above executing instructions or software to perform the operations described herein.

Instructions or software to control a processing device, processor, or computer to implement the hardware components and perform the methods as described above may be written as computer programs, code segments, instructions or any combination thereof, for individually or collectively instructing or configuring the processing device, processor, or computer to operate as a machine or special-purpose computer to perform the operations performed by the hardware components and the methods as described above. In one example, the instructions or software include machine code that is directly executed by the processing device, processor, or computer, such as machine code produced by a compiler. In another example, the instructions or software include higher-level code that is executed by the processing device, processor, or computer using an interpreter. Based on the disclosure herein, and after an understanding of the same, programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processing device, processor, or computer to implement the hardware components, such as discussed in any of FIGS. 1-4, and perform the methods as described above in any of FIGS. 1-5, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processing device, processor, or computer so that the processing device, processor, or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processing device, processor, or computer.

What is claimed is:

1. An average power tracking mode power amplifier, comprising:
a Power Amplifier (PA) comprising a driver stage configured to be driven by a first drive voltage and a main amplification stage configured to be driven by a second drive voltage;
a first Direct Current (DC)-DC voltage converter configured to generate the first drive voltage from a power voltage by controlling the first drive voltage to be equal to or lower than the power voltage, and to apply the generated first drive voltage to the driver stage;
a second DC-DC voltage converter configured to generate the second drive voltage from the power voltage by controlling the second drive voltage to be higher than the first drive voltage, and to apply the generated second drive voltage to the main amplification stage; and
an average output power measurement unit configured to measure an average output power of a Radio Frequency (RF) output signal output from the main amplification stage.

2. The average power tracking mode power amplifier of claim 1, wherein the second DC-DC voltage converter is further configured to generate the second drive voltage by boosting the power voltage based on a load line condition for the controlling of the second drive voltage, so that an output impedance of the main amplification stage matches a nominal impedance of an antenna and the average output power.

3. The average power tracking mode power amplifier of claim 2, wherein the main amplification stage and the antenna are coupled to a DC blocking capacitor.

4. The average power tracking mode power amplifier of claim 2, wherein the first DC-DC voltage converter is further configured to generate the first drive voltage by stepping down the power voltage based on a load line condition for the controlling of the first drive voltage, so that output impedance of the driver stage matches input impedance of the main amplification stage and the average output power.

5. The average power tracking mode power amplifier of claim 4, wherein the driver stage and the main amplification stage are coupled to a DC blocking capacitor.

6. The average power tracking mode power amplifier of claim 1, wherein the second DC-DC voltage converter is further configured to generate the second drive voltage from the power voltage using a buck boost for the controlling of the second drive voltage, so that the second drive voltage is lower than the power voltage and higher than the first drive voltage when the first drive voltage is lower than the power voltage.

7. The average power tracking mode power amplifier of claim 1, further comprising:
a modulation unit; and
an antenna.

8. The average power tracking mode power amplifier of claim 1, wherein 20 V is applied to the main amplification stage when the power voltage is 5 V.

9. An average power tracking mode power amplifier, comprising:
a Power Amplifier (PA) comprising a driver stage configured to be driven by a power voltage and a main amplification stage configured to be driven by a drive voltage; and
a Direct Current (DC)-DC voltage converter configured to generate the drive voltage from the power voltage by controlling the drive voltage to be higher than the power voltage, and to apply the generated drive voltage to the main amplification stage.

10. The average power tracking mode power amplifier of claim 9, wherein the DC-DC voltage converter is further configured to generate the drive voltage by boosting the power voltage based on a load line condition for the controlling of the drive voltage, so that an output impedance of the main amplification stage matches a nominal impedance of an antenna and average output power.

11. The average power tracking mode power amplifier of claim 10, wherein the main amplification stage and the antenna are coupled to a DC blocking capacitor.

12. The average power tracking mode power amplifier of claim 10, wherein 20 V is applied to the main amplification stage when the power voltage is 5 V.

13. An average power tracking mode power method, comprising:
generating a first drive voltage from a power voltage, via a first Direct Current (DC)-DC voltage converter by controlling the first drive voltage to be equal to or lower than the power voltage;
applying the generated first drive voltage to a driver stage;
driving the driver stage by the first drive voltage;
generating the second drive voltage from the power voltage, via a second DC-DC voltage converter by controlling the second drive voltage to be higher than the first drive voltage;
applying the generated second drive voltage to a main amplification stage; and
driving the main amplification stage by the second drive voltage.

14. The method claim 13, wherein the second DC-DC voltage converter is configured to generate the second drive voltage by boosting the power voltage based on a load line condition for the controlling of the second drive voltage, so that an output impedance of the main amplification stage matches a nominal impedance of an antenna and an average output power.

15. The method claim 13, wherein the first DC-DC voltage converter is configured to generate the first drive voltage by stepping down the power voltage based on a load line condition for the controlling of the first drive voltage, so that output impedance of the driver stage matches input impedance of the main amplification stage and an average output power.

16. The method claim 13, wherein the second DC-DC voltage converter is configured to generate the second drive voltage from the power voltage using buck-boost for the controlling of the second drive voltage, so that the second drive voltage is lower than the power voltage and higher than the first drive voltage when the first drive voltage is lower than the power voltage.

17. The method claim 14, wherein the main amplification stage and the antenna are coupled to a DC blocking capacitor.

18. The method claim 13, wherein 20 V is applied to the main amplification stage when the power voltage is 5 V.

* * * * *